(12) United States Patent
Wagner et al.

(10) Patent No.: US 6,788,471 B2
(45) Date of Patent: Sep. 7, 2004

(54) PROJECTION EXPOSURE APPARATUS FOR MICROLITHOGRAPHY

(75) Inventors: Christian Wagner, Eersel (NL); Wilhelm Ulrich, Aalen (DE)

(73) Assignee: Carl Zeiss Semiconductor Manufacturing Technologies AG, Oberkochen (DE)

( * ) Notice: Subject to any disclaimer, the term of this patent is extended or adjusted under 35 U.S.C. 154(b) by 0 days.

(21) Appl. No.: 10/271,775

(22) Filed: Oct. 17, 2002

(65) Prior Publication Data

US 2003/0086183 A1 May 8, 2003

(30) Foreign Application Priority Data

Oct. 17, 2001 (DE) .......................................... 101 51 309

(51) Int. Cl.[7] .......................... G02B 9/00; G02B 13/14; G03B 27/54; F21V 27/00
(52) U.S. Cl. .......................... 359/649; 359/355; 355/67; 362/268
(58) Field of Search ............................. 359/355, 649, 359/663; 355/67; 362/268

(56) References Cited

U.S. PATENT DOCUMENTS 5,831,770 A * 11/1998 Matsuzawa et al. ........ 359/649
6,104,544 A * 8/2000 Matsuzawa et al. ........ 359/649
6,243,206 B1   6/2001 Wangler ..................... 359/621
6,522,484 B1 * 2/2003 Schuster .................... 359/733

FOREIGN PATENT DOCUMENTS

EP        1 037 267         9/2000

OTHER PUBLICATIONS

"Lithography with 157 nm lasers" by T. M. Bloomstein et al, J. Vac. Sci. Technol. B 15(6), Nov./Dec. 1997, pp. 2112 to 2116.

* cited by examiner

*Primary Examiner*—David N. Spector
(74) *Attorney, Agent, or Firm*—Walter Ottesen

(57) ABSTRACT

The invention relates to a projection exposure apparatus for microlithography at $\lambda<200$ nm. The projection exposure apparatus for microlithography has a light source with a wavelength less than 200 nm and a bandwidth, which is less than 0.3 pm, preferably less than 0.25 pm and greater than 0.1 pm. The projection exposure apparatus includes an exclusively refractive projection objective which is made out of a single lens material. The projection objective provides for a maximum image height in the range of 12 mm to 25 mm, an image side numerical aperture in the range of 0.75 up to 0.95 and a monochromatic correction of the wavefront of rms<15‰ of the wavelength of the light source.

14 Claims, 4 Drawing Sheets

PROJECTION EXPOSURE APPARATUS FOR MICROLITHOGRAPHY

FIELD OF THE INVENTION

The invention relates to a projection exposure apparatus for microlithography with a light source having a wavelength less than 200 nm and a bandwidth less than 0.3 pm, preferably less than 0.2 pm and with an exclusively refractive projection objective made of a single lens material.

BACKGROUND OF THE INVENTION

European patent publication 1 037 267 discloses a projection exposure apparatus for microlithography used for transferring a mask pattern onto a substrate such as a semiconductor device. The dimensions of structures which can be generated on the substrate are limited by dispersion in the optical system of the projection exposure apparatus. In using light for illumination having a bandwidth $\Delta\lambda$ which is comparatively narrow, the effects of dispersion can be minimized. European patent publication 1 037 267 teaches that the maximum tolerable bandwidth $\Delta\lambda$ of the light for illumination is proportional to $L/NA^2$, with L being the inter object-image distance and NA denoting the numerical aperture. It is suggested to use $F_2$-lasers or YAG lasers as light sources for illumination providing illumination light having a wavelength shorter than 193 nm and 157 nm, respectively. As an example, in European patent publication 1 037 267, an exclusively spherical projection objective is described which consists of 27 lenses with NA=0.6, L=1000 mm, magnification $\beta$=−0.25, infinite focal length and maximum image height Y=13.2 mm.

Lithography by means of 157 nm lasers is described in T. M. Bloomstein et al, J. Vac. Sci. Technol. B 15(6), November/December 1997, p. 2112–2116.

This publication suggests that in lithographic systems using laser illumination light at $\lambda$=157 nm, exclusively refractive projection objectives could consist of lenses made of a single lens material. For lithography however the bandwidth of the laser light should be narrowed as known for lasers providing laser light at $\lambda$=193 nm.

In "Clearing the Hurdles in the 157 nm Race", Phil Ware, Canon Submicron Focus, Summer 2000, p. 17, several projection objectives for $\lambda$=157 nm are described. For such refractive single material projection objectives, a narrowing of the bandwidth to within a range of 0.1 to 0.2 pm is deemed necessary.

U.S. Pat. No. 6,243,206 discloses an illuminating system for ultraviolet microlithography at 157 nm wavelength. This system has refractive optical elements made of fluoride material and includes both a microlens array functioning as an element for increasing the light conductance value and a honeycomb condenser.

It is well known how to narrow the bandwidth of present day lasers at $\lambda$=193 nm and $\lambda$=157 nm. However, the narrower the bandwidth of the laser light, the greater the loss in efficiency of the corresponding laser and the higher the production costs of such an apparatus.

In pure quartz glass objectives for $\lambda$=248 nm and achromatic objectives for $\lambda$=193 nm, numerical apertures of 0.7 to 0.9 are state of the art.

SUMMARY OF THE INVENTION

In the field of microlithography, enhanced resolution can only be achieved by reducing the wavelength and only if a high image side numerical aperture in the order of magnitude of 0.7 to 0.9 is maintained.

The object of the present invention is to provide a projection exposure apparatus as described hereinafter which allows for a gain in resolution while affording the advantages of illumination at a reduced wavelength.

This object is achieved by a projection exposure apparatus for microlithography which includes a light source having a wavelength of less than 200 nm and a bandwidth of less than 0.3 pm, preferably less than 0.25 pm, and greater than 0.1 pm; and, an exclusively refractive projection objective made of a single lens material. The projection objective has: a maximum image height in the range of 12 mm up to 25 mm; an image side numerical aperture in the range of 0.75 to 0.95; and, a monochromatic correction of the wavefront to rms<15‰ of the wavelength of the light source.

The parameters of the optics of such a projection apparatus allow for the imaging quality achieved at higher wavelengths or in achromatic 193 nm projection exposure apparatuses.

The large image field as represented by the image height allows for a high throughput and for correspondence to the exposure field of other machines operating under less demanding structural requirements. Only with such a high numerical aperture is it possible to achieve a gain in resolution using light of wavelength $\lambda$=157 nm for illumination compared to light for illumination at wavelength $\lambda$193 nm. The resolution which can be achieved is proportional to the ratio of the wavelength $\lambda$ of the illumination light and the image side numerical aperture NA, that is $\lambda$/NA. For $\lambda$=193 nm and NA=0.9, this ratio is 193 nm/0.9=214 nm, for $\lambda$=157 nm and NA=0.6, the ratio is 157 nm/0.6=261 nm, which is remarkably greater, and for $\lambda$=157 nm and NA=0.75, the ratio is 157 nm/0.75=209 nm, which corresponds approximately to the ratio at $\lambda$=193 nm. This means that for the range of the numerical aperture of 0.75 to 0.95, a gain in resolution is possible by using illumination light having wavelength $\lambda$=157 nm as compared to illumination light having wavelength $\lambda$=193 nm. Because of the high numerical aperture, the quality of imaging is increased as compared to state of the art systems especially at $\lambda$=193 nm.

The high quality correction of the projection objective to a monochromatic image plane wavefront error of rms<15‰ ensures that, all over the image field, use can be made of the high resolution, which is achieved because of the small wavelength and the high aperture. Furthermore, this allows for form-correct undistorted imaging all over the image plane. For comparison, in the field of optics, a system having an image error, the magnitude of which corresponds to the ratio of the wavelength and the image side numerical aperture, is usually considered to be limited by diffraction. It should be noted that this error is up to five hundred times greater than with the projection exposure apparatus of the present invention.

In a preferred embodiment of the invention there is an illumination system providing for an increase of the geometrical light flux, that means an increase of the etendue. Preferably also homogenization and variable illumination aperture are provided. The projection illumination apparatus may provide for an annular aperture, a quadrupolar illumination as well as a variable coherence length. Such projection exposure apparatus allows for the best structure-related resolution. Without such an illumination system, a projection exposure apparatus at 157 nm or 193 nm does not provide advantages for many types of structures with respect to conventional projection exposure apparatuses.

In another preferred embodiment of the present invention, there is at least one lens in the projection objective having an aspherical surface. Lenses with an aspherical lens surface allow a reduction of the path length which the light has to travel through the optical elements of an objective. This reduces not only absorption and hence dissipation of energy in the lens material but also allows less lens material to be used and reduces the number of lenses required in a projection objective. This is of interest in view of the extraordinarily high costs of the lens material, in particular the costs of $CaF_2$. Furthermore, these aspherical surfaces allow for a relatively small number of lenses or refractive surfaces such that also reflection losses and thus production costs are reduced.

Preferably fluorides are used as lens material. Such material is particularly apt for illumination with light at wavelength $\lambda=157$ nm. Preferably, $CaF_2$ may be used but lenses could also be made of $BaF_2$ or $LiF_2$. In a preferred embodiment, single crystalline fluorides are used as optical elements in the projection exposure apparatus which are chosen for having highest transparency in the wavelength range of the illumination light which is used. Besides fluorides, also quartz glass could be used as a lens material, in particular at wavelength $\lambda=193$ nm. At lower wavelengths also fluoride-doped quartz glass could also be used.

Preferably the chromatic longitudinal aberration is chosen to be less than 5‰ of the wavelength of the light of the light source so the order of magnitude of the chromatic error does not exceed the order of the monochromatic error. Then the chromatic error is not significantly detrimental to the resolution of the projection exposure apparatus. For a given dispersion of the lens material, this is achieved by reducing the bandwidth of the light source and by optimizing the bandwidth of the projection objective.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
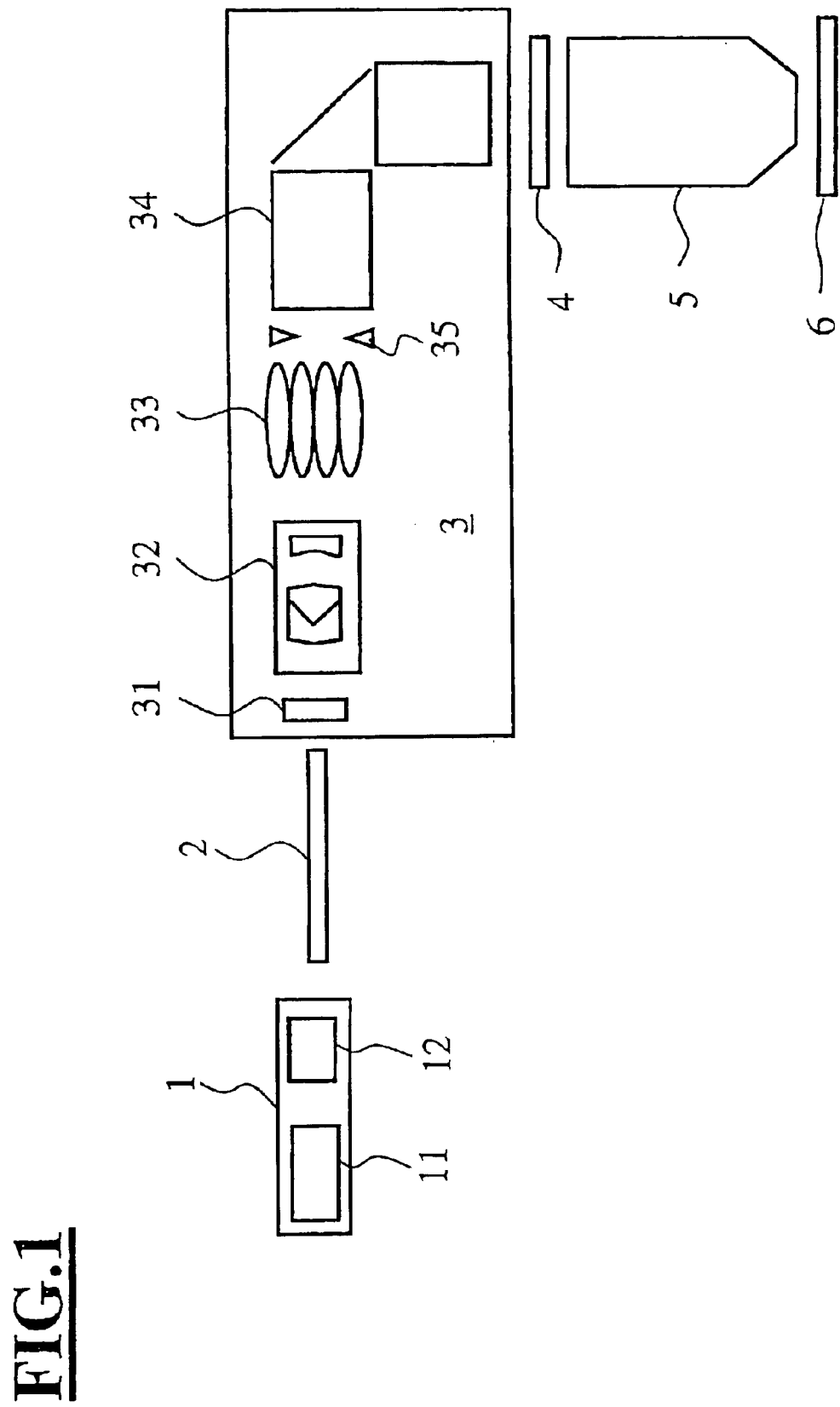
FIG. 1 is a schematic view of a projection exposure apparatus.

The projection exposure apparatus shown in FIG. 1 has a light source 1 providing illumination light having a wavelength below 200 nm. The light source includes an ArF-laser 11 of wavelength $\lambda=193$ nm. As an alternative to the ArF-laser 11, a $F_2$-laser may be used providing illumination light at wavelength $\lambda=157$ nm. The projection exposure apparatus further includes a unit 12 for narrowing of the laser bandwidth of the laser 11. This unit 12 may be integrated in the laser resonator and provides a laser bandwidth of below 0.3 pm, preferably below 0.25 pm. Extreme narrowing of the laser bandwidth to values below 0.1 pm is not required.

The maximum tolerable bandwidth of the illumination light used in present projection exposure apparatus is deduced from the requirement that the limiting chromatic longitudinal error CHL is smaller than half a Rayleigh unit RE, that is, $$CHL(\Delta\lambda) < \frac{1}{2}\lambda/NA^2.$$

The bandwidth $\Delta\lambda$ follows from the ratio of $CHL(\Delta\lambda)$ and the chromatic longitudinal error of the objective design normalized to 1 nm, that is, CHL(/nm):

$$\Delta\lambda = \frac{CHL(\Delta\lambda)}{CHL(/nm)} = \frac{\frac{1}{2}\lambda/NA^2}{CHL(/nm)}.$$

The UV-light is guided to the illumination system 3 via a laser beam line 2 coupled to the light source 1. For allowing optimum projection microlithography with the laser light, the illumination system includes means 31 for enhancing the divergence of the illuminating light. These means 31 for enhancing the divergence of the illumination light are formed by one or more optical elements. These elements are patterned and include refractive or diffractive microlenses. As an alternative to the microlenses, a scattering disk may be used for enlarging divergence of the illumination light.

The means for enhancing divergence of the illumination light is followed by means for setting the spatial coherence a of the illumination light and means for setting the type of illumination as, for example, annular, dipolar or quadrupolar illumination. These means include an integrated zoom-axicon group 32. Alternatively some other corresponding transforming means could be included. It is required that these means obstruct as little light as possible.

The integrated zoom-axicon group 32 is followed by a homogenizer-lightmixer-integrator in form of a honeycomb condenser 33. As an alternative, a glass bar, preferably out of crystalline fluoride or a corresponding mirror box may be used. The homogenizer-lightmixer-integrator is designed for short optical pathlengths in the transparent material.

An objective 34 generates a border-sharp image of a reticle mask (REMA) 35 on the reticle 4 where the homogeneity of the light intensity is greatest.

The reticle 4 is illuminated in a telecentric way. Preferably there is fine adjustment of the reticle 4 to the telecentric properties of the projection objective 5 as explained below. The substrate 6, which is to be exposed, is positioned below the projection objective. For example, such substrate may be a wafer for manufacturing microelectronic devices. However it is noted that the substrate could also be formed by other elements which are to be microstructured as, for example, microoptical or micromechanical devices.

The reticle 4 and the substrate 6 are aligned with respect to the projection objective 5 and the illumination system 3 in a highly precise way. They are moved precisely in response to step-and-repeat, step-and-scan or stitching.

Due to the high absorption of the UV-light of below 200 nm, the light path is held free from strongly absorbing materials as, for example, water vapor. Because of the high UV-light power, the atmosphere is kept free from $O_2$ in order to avoid photochemical corrosion. This is done by providing a special atmosphere around the optics. Such a special atmosphere may include nitrogen or helium as appropriate gases or a vacuum.

In the following, different embodiments for the projection objective 5 in FIG. 1 are presented. All these objectives are refractive objectives and consist of lenses made out of a single lens material.

Figure 2:
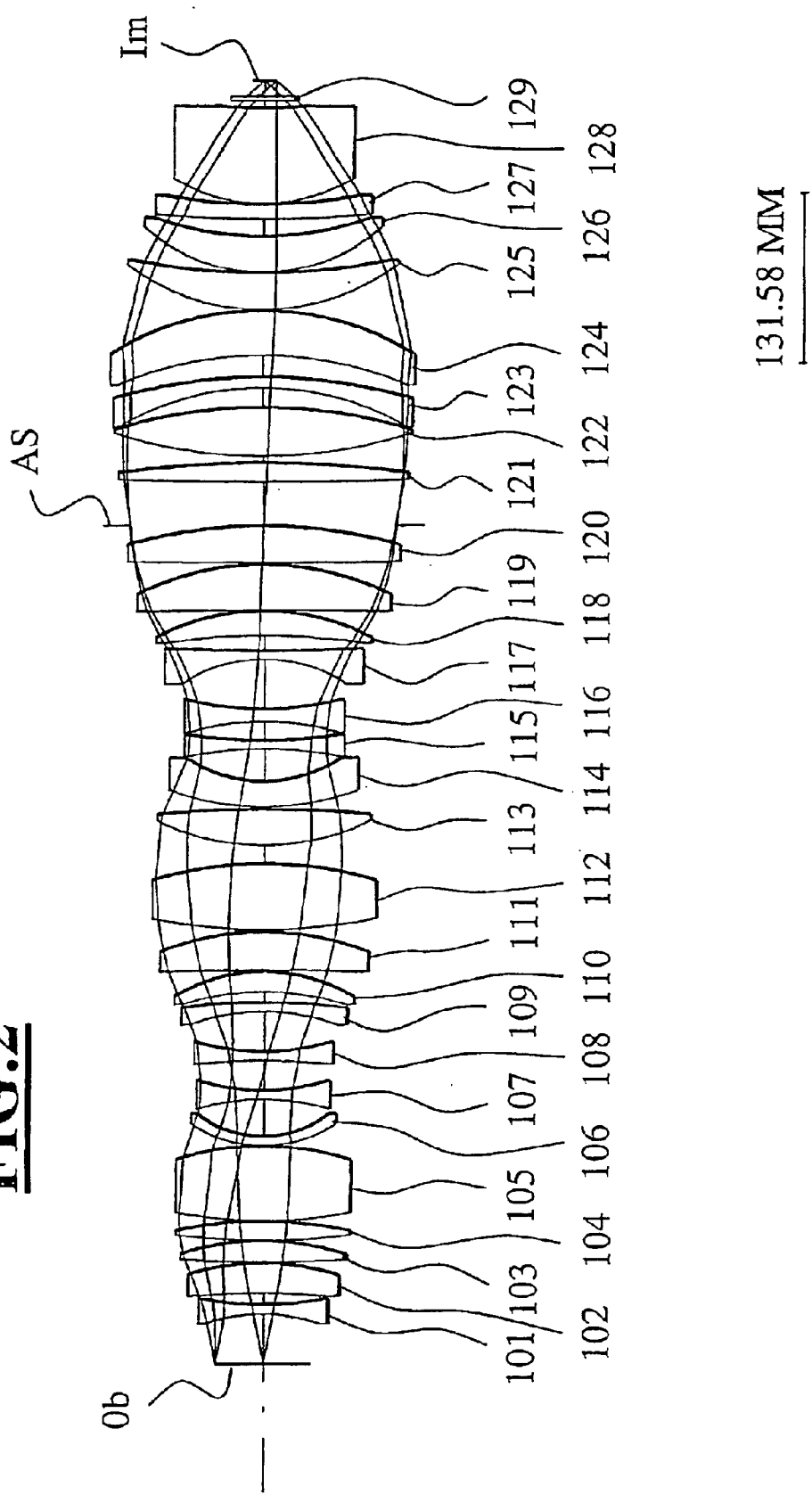
FIG. 2 is a sectional view of the lens arrangement of a first projection objective embodiment.

FIG. 2 shows a first projection objective embodiment. The technical design data for this objective are given in TABLE 1. The projection objective is characterized by the following parameters:

| | |
|---|---|
| magnification: | $\beta = -\frac{1}{4}$ |
| image side numerical aperture: | NA = 0.75 |

-continued

| | |
|---|---|
| image field: | 17 × 6 mm² (for stitching) |
| inter-object image distance: | 1000 mm |
| operating wavelength (F₂-laser): | 157 nm |
| maximum rms of the monochromatic wavefront error over the total image field: | 10 mλ (1.57 nm) |
| chromatic longitudinal aberration (1 nm): | 0.64 pm/nm |
| useable laser bandwidth: | 0.22 pm |
| resolution: | ~100 nm |
| largest lens diameter: | 225 mm |

The given resolution res is calculated from res=$K_1 \lambda$/NA, where $K_1$=0.5 denotes a process parameter, $\lambda$ is the wavelength of the illumination light and NA is the image side numerical aperture.

Referring to FIG. 2, between the object plane Ob and the image plane Im, the objective has five lens groups. The first lens group includes lenses 101–106. The second lens group has lenses 107 and 108. The third lens group includes lenses 109–114. The fourth lens group has lenses 115 and 116. The fifth lens group includes lenses 117 to 128. The objective has an end plate 129 which is plane-parallel. All these optical elements consist of single crystalline $CaF_2$. The objective corresponds to a basic design for microlithography projection objectives. This design includes two beam waists and provides for several negative lenses (101, 107–109 and 114–117) at these beam waists. On the object end, there is a biconcave lens 101. This biconcave lens 101 is the first lens in the lens arrangement. This lens has a working distance to the object plane which is sufficiently large.

The system aperture AS lies in the region of the third extended antinode, where a negative meniscus lens 123 is provided.

Three aspherical surfaces of the lenses 105, 109, 127 allow for enlarging the correction degrees of freedom so that a high imaging quality can be achieved with a limited number of lenses.

The projection objective includes two aspherical lens surfaces 105, 109 in the region of the first antinode and the first waist and both face toward the image plane. The projection objective further includes another aspherical surface, which as seen from the image end of the objective, is the last aspherical surface 127 of the objective. This aspherical surface 127 faces away from the image plane. All these aspherical surfaces are convex surfaces. Such convex lens surfaces are more easy to manufacture and to examine as compared to concave lens surfaces.

It is to be noted that there is no asphere in the region of the system aperture AS. of course, more aspherical surfaces of lenses may be provided. However, due to the much greater effort which is needed with regard to manufacturing and examination, as few aspheres as possible should be used.

Figure 3:
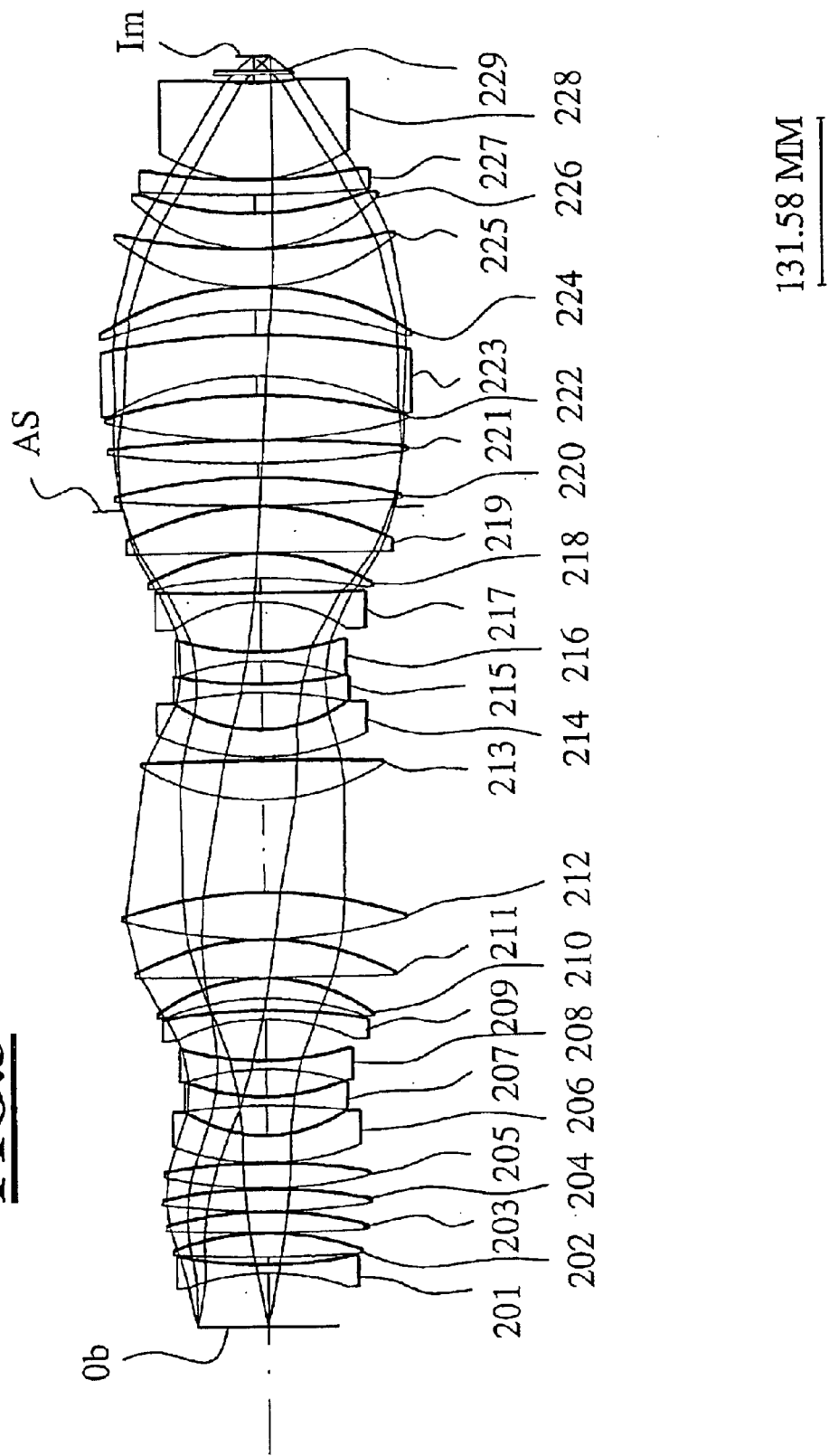
FIG. 3 is a sectional view of the lens arrangement of a second projection objective embodiment.

FIG. 3 shows a second objective embodiment. The technical design data for this objective are given in TABLE 2.

Between the object plane Ob and the image plane Im, the objective also has five lens groups. The first lens group includes lenses 201 to 206. The second lens group has lenses 207 and 208. The third lens group includes lenses 209 to 214. The fourth lens group has lenses 215 and 216. The fifth lens group includes lenses 217 to 228. The objective has an end plate 229 which is plane-parallel. The second projection objective is of the same quality as the first projection objective. However a larger image field is provided. This objective still may be used for classical step-and-scan processes. The parameters of the second objective are as follows:

| | |
|---|---|
| magnification: | $\beta = -\frac{1}{4}$ |
| image side numerical aperture: | NA = 0.75 |
| image field: | 26 × 8 mm² |
| inter-object image distance: | 1000 mm |
| operating wavelength (F₂-laser): | 157 nm |
| maximum rms of the monochromatic wavefront error over the total image field: | 11 mλ |
| chromatic longitudinal aberration (1 nm): | 0.72 μm/nm |
| useable laser bandwidth: | 0.19 pm |
| resolution: | ~100 nm |
| largest lens diameter: | 235 mm |

Figure 4:
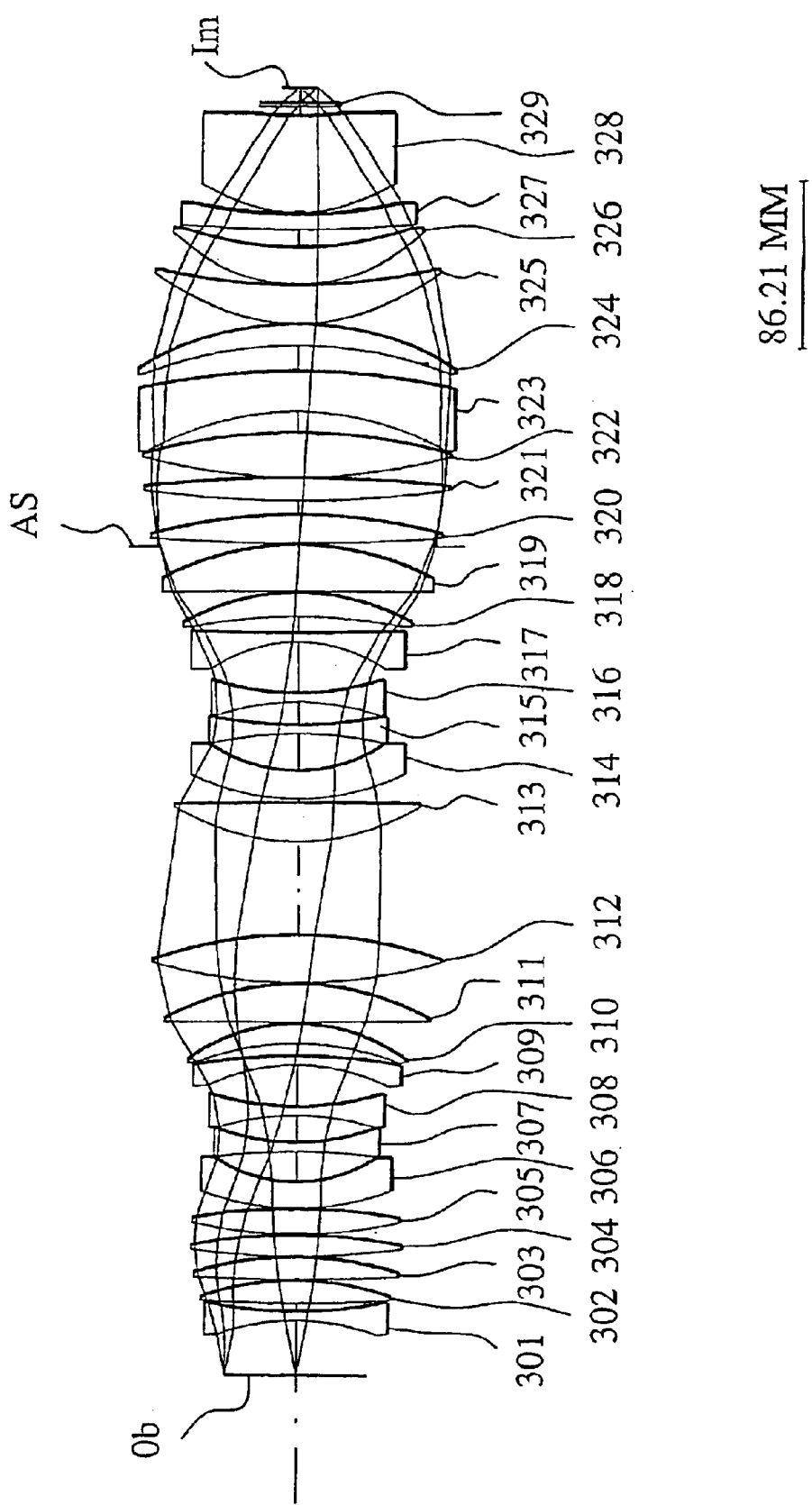
FIG. 4 is a sectional view of the lens arrangement of a third projection objective embodiment.

FIG. 4 shows a third objective embodiment. Between the object plane Ob and the image plane Im, the objective has five lens groups. The first lens group includes lenses 301–306. The second lens group has lenses 307 and 308. The third lens group includes lenses 309–314. The fourth lens group has lenses 315 and 316. The fifth lens group includes lenses 317 to 328. The technical design data for this objective are given in TABLE 3. This projection objective is a switching objective where the inter-object image distance is reduced to ⅔ as compared with the objectives shown in FIGS. 2 and 3. Consequently, absorption losses for this objective are correspondingly reduced because of the shorter optical light path through the lenses. Furthermore, less $CaF_2$-material for the lenses is needed as the material required is reduced to less than half of the volume for the objectives shown in FIGS. 2 and 3. Therefore, this objective design allows for a decisive reduction in production cost.

The parameters of the projection objective shown in FIG. 4 are given below:

| | |
|---|---|
| magnification: | $\beta = -\frac{1}{4}$ |
| image side numerical aperture: | NA = 0.75 |
| image field: | 17 × 6 mm² |
| inter-object image (distance): | 663 mm |
| operating wavelength (F₂-laser): | 157 nm |
| maximum rms of the monochromatic wavefront error over the total image field: | 7 mλ |

The sectional view of the lens arrangement of the second and third projection objective embodiment are very similar. In a first approximation, it can be said, that the third embodiment is just a scaled-down version of the second embodiment. The third embodiment is characterized by a relatively long free drift length in the area of the second antinode of the optical beam path. Apart from this, the characteristics of the first embodiment are also met in the third embodiment.

Overall, the invention shows, that it is possible to use projection objectives which are exclusively refractive and which are not made achromatic by means of two different lens materials for carrying out microlithography at wavelength $\lambda$=157 nm and also at wavelength $\lambda$=193 nm while working at standard laser light bandwidths widely used in the field of microlithography. It is possible to build projection exposure apparatuses having the required high image side numerical aperture. Appropriate illumination systems providing for the necessary flexibility in terms of different illumination modes are available. A diminishing of the image field in terms of stitching allows saving of expensive lens material and makes the construction less expensive.

It is understood that the foregoing description is that of the preferred embodiments of the invention and that various changes and modifications may be made thereto without departing from the spirit and scope of the invention as defined in the appended claims.

TABLE 1

157 nm: 4×/0.75   17 × 6 mm

| ELEMENT NUMBER | RADIUS FRONT | RADIUS BACK | THICKNESS | USED DIAMETER FRONT |
|---|---|---|---|---|
| OB | INF | | 21.2160 | 80.5345 |
| | | | 7.2553 | |
| 101 | −115.7621 CC | 213.1810 CC | 4.6410 | 80.5443 |
| | | | 4.2404 | |
| 102 | 792.2783 CX | −136.4601 CX | 12.3286 | 90.2142 |
| | | | 0.3315 | |
| 103 | 1067.0745 CX | −181.7748 CX | 11.0939 | 98.4446 |
| | | | 0.3315 | |
| 104 | 378.1984 CX | −265.5741 CX | 11.4883 | 102.3597 |
| | | | 0.3315 | |
| 105 | 224.6510 CX | A (1) | 12.9746 | 101.2653 |
| | | | 0.3315 | |
| 106 | 133.5672 CX | 71.0135 CC | 13.6914 | 92.4091 |
| | | | 15.6747 | |
| 107 | −337.6630 CC | 109.9077 CC | 4.6410 | 80.0859 |
| | | | 14.0503 | |
| 108 | −131.6748 CC | 150.8187 CC | 4.6410 | 78.5863 |
| | | | 20.8572 | |
| 109 | −104.0376 CC | A (2) | 4.6410 | 89.9352 |
| | | | 6.1949 | |
| 110 | −143.8077 CC | −93.3047 CX | 10.1477 | 102.5910 |
| | | | 0.6281 | |
| 111 | 5969.0673 CX | −134.8494 CX | 19.7977 | 126.6423 |
| | | | 0.3315 | |
| 112 | 263.7742 CX | −215.7957 CX | 24.3807 | 140.6339 |
| | | | 48.1858 | |
| 113 | 113.7579 CX | −2952.2070 CX | 20.6518 | 119.8425 |
| | | | 1.8185 | |
| 114 | 122.7460 CX | 75.1878 CC | 14.5159 | 103.7065 |
| | | | 19.3036 | |
| 115 | −201.8765 CC | 212.7200 CC | 4.6410 | 86.2873 |
| | | | 12.0563 | |
| 116 | −119.9368 CC | 140.1595 CC | 4.6410 | 82.0743 |
| | | | 6.4165 | |
| 117 | −75.1970 CC | 2139.9405 CC | 4.6924 | 87.3250 |
| | | | 8.1650 | |
| 118 | −272.6518 CC | −115.0768 CX | 12.5284 | 107.0978 |
| | | | 0.4687 | |
| 119 | −5512.2722 CC | −144.7103 CX | 23.6457 | 126.2784 |
| | | | 0.4584 | |
| 120 | 970.7047 CX | −274.1440 CX | 14.9265 | 141.2732 |
| | | | −16.5750 | |
| | | APERTURE STOP | | 139.9019 |
| | | | 21.7740 | 145.4872 |
| | | | 1.9890 | |
| 121 | 571.8065 CX | −697.0709 CX | 11.7771 | 148.1741 |
| | | | 0.3315 | |
| 122 | 301.5827 CX | −274.0065 CX | 22.9521 | 150.2673 |
| | | | 10.8509 | |
| 123 | −146.5289 CC | −353.9458 CX | 20.8507 | 149.5282 |
| | | | 12.8151 | |
| 124 | −213.2199 CC | −145.9024 CX | 11.9362 | 153.2562 |
| | | | 0.3321 | |
| 125 | 112.5118 CX | 289.2105 CC | 19.4075 | 138.7339 |
| | | | 0.5204 | |
| 126 | 88.5495 CX | 163.9744 CC | 18.2007 | 121.4501 |
| | | | 9.5730 | |
| 127 | A (3) | 275.3482 CC | 8.0308 | 113.7185 |
| | | | 0.6374 | |
| 128 | 90.0474 CX | 198.6691 CC | 50.2333 | 93.0110 |
| | | | 4.0611 | |
| 129 | INF | INF | 1.9890 | 38.3454 |
| | IMAGE DISTANCE = | | 7.9560 | |
| IM | INF | | | 18.0000 |

TABLE 1-continued 157 nm: 4×/0.75   17 × 6 mm

ASPHERICAL CONSTANT $$Z = \frac{(CURV)Y^2}{1 + \{1 - (1+K)(CURVY)^2\}^{\frac{1}{2}}} + AY^4 + BY^6 + CY^8 + DY^{10}$$

| ASPHERIC | CURVE | K | A | B | C | D |
|---|---|---|---|---|---|---|
| A (1) | −0.00266392 | 0.000000 | −1.16728E−07 | −4.98736E−12 | 1.05871E−15 | −1.10882E−19 |
| A (2) | −0.00302040 | 4.403490 | −1.93335E−08 | −5.16149E−12 | 1.76471E−17 | −8.44115E−20 |
| A (3) | 0.00157186 | 0.000000 | −6.86103E−09 | −3.01927E−12 | 4.16805E−16 | −2.20170E−20 |

TABLE 2

157 nm: 4×/0.75   26 × 8 mm

| ELEMENT NUMBER | RADIUS FRONT | RADIUS BACK | THICKNESS | USED DIAMETER FRONT |
|---|---|---|---|---|
| OB | INF | | 32.0000 | 121.6828 |
| | | | 10.9432 | |
| 201 | −174.6035 CC | 321.5400 CC | 7.0000 | 121.6828 |
| | | | 6.3958 | |
| 202 | 1194.9899 CX | −205.8222 CX | 18.5952 | 136.2957 |
| | | | 0.5000 | |
| 203 | 1609.4638 CX | −274.1701 CX | 16.7329 | 148.7297 |
| | | | 0.5000 | |
| 204 | 570.4350 CX | −400.5643 CX | 17.3278 | 154.6429 |
| | | | 0.5000 | |
| 205 | 338.8401 CX | A (1) | 19.5696 | 152.9796 |
| | | | 0.5000 | |
| 206 | 201.4588 CX | 107.1093 CC | 20.6507 | 139.5639 |
| | | | 23.6421 | |
| 207 | −509.2957 CC | 165.7732 CC | 7.0000 | 120.9462 |
| | | | 21.1920 | |
| 208 | −198.6045 CC | 227.4791 CC | 7.0000 | 118.6559 |
| | | | 31.4588 | |
| 209 | −156.9194 CC | A (2) | 7.0000 | 135.7457 |
| | | | 9.3437 | |
| 210 | −216.9046 CC | −140.7311 CX | 15.3058 | 154.8468 |
| | | | 0.9474 | |
| 211 | 9003.1181 CX | −203.3927 CX | 29.8608 | 191.1726 |
| | | | 0.5000 | |
| 212 | 397.8494 CX | −325.4837 CX | 36.7732 | 212.2835 |
| | | | 72.6784 | |
| 213 | 171.5806 CX | −4452.8009 CX | 31.1490 | 180.8390 |
| | | | 2.7428 | |
| 214 | 185.1372 CX | 113.4055 CC | 21.8943 | 156.4745 |
| | | | 29.1156 | |
| 215 | −304.4895 CC | 320.8446 CC | 7.0000 | 130.1909 |
| | | | 18.1845 | |
| 216 | −180.9001 CC | 211.4019 CC | 7.0000 | 123.8256 |
| | | | 39.8440 | |
| 217 | −113.4193 CC | 3227.6629 CC | 7.0775 | 131.7270 |
| | | | 12.3152 | |
| 218 | −411.2396 CC | −173.5699 CX | 18.8966 | 161.5430 |
| | | | 0.7069 | |
| 219 | −8314.1361 CC | −218.2659 CX | 35.6647 | 190.4642 |
| | | | 0.6914 | |
| 220 | 1464.1097 CX | −413.4902 CX | 22.5136 | 213.0816 |
| | | | −25.0000 | |
| | APERTURE STOP | | | 211.0134 |
| | | | 32.8416 | 219.4460 |
| | | | 3.0000 | |
| 221 | 862.4532 CX | −1051.3889 CX | 17.7633 | 223.5023 |
| | | | 0.5000 | |
| 222 | 454.8759 CX | −413.2828 CX | 34.6186 | 226.6665 |
| | | | 16.3664 | |
| 223 | −221.0089 CC | −533.8549 CX | 31.4490 | 225.5555 |
| | | | 19.3290 | |
| 224 | −321.5987 CC | −220.0639 CX | 18.0032 | 231.1908 |
| | | | 0.5008 | |

TABLE 2-continued 157 nm: 4x/0.75   26 × 8 mm

| | | | | |
|---|---|---|---|---|
| 225 | 169.7010 CX | 436.2150 CC | 29.2723 | 209.2933 |
| | | 0.7849 | | |
| 226 | 133.5588 CX | 247.3219 CC | 27.4520 | 183.2223 |
| | | 14.4389 | | |
| 227 | A (3) | 415.3065 CC | 12.1128 | 171.5813 |
| 228 | 135.8181 CX | 299.6517 CC | 75.7667 | 140.3340 |
| | | 6.1253 | | |
| 229 | INF | INF | 3.0000 | 57.8902 |
| | IMAGE DISTANCE = | | 12.0000 | |
| IM | INF | | | 27.2000 |

ASPHERICAL CONSTANT $$Z = \frac{(CURV)Y^2}{1 + \{1 - (1 + K)(CURV Y)^2\}^{\frac{1}{2}}} + AY^4 + BY^6 + CY^8 + DY^{10}$$

| ASPHERIC | CURVE | K | A | B | C | D |
|---|---|---|---|---|---|---|
| A (1) | −0.00176618 | 0.000000 | −3.40187E−08 | −6.38908E−13 | 5.96171E−17 | −2.74461E−21 |
| A (2) | −0.00200252 | 4.403490 | −5.63445E−09 | −6.61216E−13 | 9.93728E−19 | −2.08941E−21 |
| A (3) | 0.00104214 | 0.000000 | −1.99954E−09 | −3.86786E−13 | 2.34708E−17 | −5.44979E−22 |

TABLE 3

157 nm: 4x/0.75   17 × 6 mm

| ELEMENT NUMBER | RADIUS FRONT | RADIUS BACK | THICKNESS | USED DIAMETER FRONT |
|---|---|---|---|---|
| OB | INF | | 32.0000 | 84.8858 |
| | | | 6.8417 | |
| 301 | −135.4093 CC | 229.3553 CC | 7.0368 | 84.8926 |
| | | 8.9677 | | |
| 302 | −587.1142 CC | −189.7989 CX | 24.1492 | 96.6246 |
| | | 0.5238 | | |
| 303 | 970.0801 CX | −192.3938 CX | 16.5734 | 119.5385 |
| | | 0.5000 | | |
| 304 | 529.1899 CX | −311.9989 CX | 14.9339 | 127.0740 |
| | | 0.5000 | | |
| 305 | 349.2830 CX | A (1) | 57.7213 | 127.6292 |
| | | 0.5000 | | |
| 306 | 95.5355 CX | 80.0780 CC | 7.4216 | 106.0867 |
| | | 28.0759 | | |
| 307 | −168.2831 CC | 152.9631 CC | 7.1651 | 96.9080 |
| | | 21.9848 | | |
| 308 | −509.7405 CC | 170.3994 CC | 7.3791 | 97.6597 |
| | | 30.5973 | | |
| 309 | −163.7568 CC | A (2) | 7.4717 | 111.4582 |
| | | 8.7087 | | |
| 310 | −191.7537 CC | −132.1552 CX | 15.4691 | 123.9992 |
| | | 0.7751 | | |
| 311 | −3068.5173 CC | −207.2864 CX | 30.2084 | 145.3721 |
| | | 1.7561 | | |
| 312 | 452.9540 CX | −302.0775 CX | 50.9848 | 161.9745 |
| | | 15.0782 | | |
| 313 | 184.2073 CX | −852.4844 CX | 27.4056 | 156.8187 |
| | | 2.0300 | | |
| 314 | 193.6735 CX | 104.8016 CC | 20.4756 | 138.3805 |
| | | 25.5897 | | |
| 315 | −267.6202 CC | 389.1276 CC | 7.0000 | 116.6552 |
| | | 13.8184 | | |
| 316 | −209.6258 CC | 229.3549 CC | 9.8674 | 113.3445 |
| | | 39.3155 | | |
| 317 | −112.5355 CC | 1428.0917 CC | 7.0498 | 123.7205 |
| | | 12.1163 | | |
| 318 | −513.9830 CC | −177.1624 CX | 18.8131 | 152.8362 |
| | | 0.5025 | | |
| 319 | −6367.0019 CC | −217.2489 CX | 35.7995 | 177.7169 |
| | | 1.4058 | | |
| 320 | 10263.8608 CX | −383.6591 CX | 28.1866 | 197.5246 |
| | | 0.1919 | | |

TABLE 3-continued 157 nm: 4×/0.75   17 × 6 mm

|     |             | APERTURE STOP |         | 202.8911 |
|-----|-------------|---------------|---------|----------|
|     |             |               | 31.5278 | 212.0771 |
|     |             |               | 3.000   |          |
| 321 | 3132.5342 CX | −826.3717 CX | 14.8348 | 213.8222 |
|     |             | 5.5342        |         |          |
| 322 | 365.2260 CX | −371.2824 CX  | 38.0908 | 220.1417 |
|     |             | 15.2812       |         |          |
| 323 | −210.6493 CC | −403.5697 CX | 8.2553  | 218.9190 |
|     |             | 16.7168       |         |          |
| 324 | −278.1561 CC | −213.3805 CX  | 34.9977 | 220.1415 |
|     |             | 0.8777        |         |          |
| 325 | 170.4222 CX | 474.9380 CC   | 28.2159 | 200.4015 |
|     |             | 0.5616        |         |          |
| 326 | 135.3877 CX | 232.6450 CC   | 27.1639 | 175.2321 |
|     |             | 13.7033       |         |          |
| 327 | A (3)       | 406.4696 CC   | 11.5043 | 159.6505 |
|     |             | 0.5322        |         |          |
| 328 | 131.3181 CX | 286.5078 CC   | 75.6193 | 131.7867 |
|     |             | 5.6921        |         |          |
| 329 | INF         | INF           | 3.0000  | 48.6905  |
|     |             | 12.0003       |         |          |
| IM  | INF         |               |         | 18.0000  |

ASPHERICAL CONSTANT $$Z = \frac{(CURV)Y^2}{1 + \{1 - (1+K)(CURVY)^2\}^{\frac{1}{2}}} + AY^4 + BY^6 + CY^8 + DY^{10}$$

| ASPHERIC | CURVE | K | A | B | C | D |
|---|---|---|---|---|---|---|
| A (1) | −0.00442028 | 0.000000 | −4.53266E−08 | 1.67151E−12 | −4.93581E−18 | −1.68355E−21 |
| A (2) | −0.00223038 | 4.403490 | 1.38023E−08 | −2.44399E−12 | 1.81046E−17 | −7.23412E−21 |
| A (3) | 0.00127570 | 0.000000 | −2.95475E−09 | −3.47798E−13 | 1.98122E−17 | −4.57061E−22 |

What is claimed is:

1. A projection exposure apparatus for microlithography comprising:
   a light source for transmitting light along a beam path at a wavelength of less than 200 nm and a bandwidth of less than 0.3 pm;
   an exclusively refractive projection objective arranged on said beam path and being made of a single lens material;
   said projection objective having a maximum image height in a range of 12 mm to 25 mm and an image side numerical aperture in a range of 0.75 to 0.95; and,
   said projection objective being configured to provide a monochromatic correction of a wavefront to rms<15‰ of said wavelength of said light source.

2. The projection exposure apparatus of claim 1, further comprising an illumination system incorporating said light source and providing for at least one of: increase of the geometrical light flux, homogenization, variable illumination, variable illumination aperture, annular aperture, bipole illumination and quadrupole illumination providing for variable coherence length.

3. The projection exposure apparatus of claim 1, wherein said projection objective includes at least one aspherical surface.

4. The projection exposure apparatus of claim 3, wherein said aspherical surface is a convex surface.

5. The projection exposure apparatus of claim 3, wherein said projection objective comprises a first, a second, a, third, a fourth and a fifth lens group.

6. The projection exposure apparatus of claim 5, wherein said second lens group and said fourth lens group have a negative refraction power and said first lens group includes at least one lens having an aspherical lens surface.

7. The projection exposure apparatus of claim 6, wherein said aspherical lens surface is a convex surface.

8. The projection exposure apparatus of claim 5, wherein said second lens group and said fourth lens group have a negative refraction power and said third lens group includes at least one lens having an aspherical lens surface.

9. The projection exposure apparatus of claim 8, wherein said aspherical lens surface is a convex surface.

10. The projection exposure apparatus of claim 5, wherein said second lens group and said fourth lens group have a negative refraction power and said fifth lens group includes a negative lens having an aspherical lens surface.

11. The projection exposure apparatus of claim 10, wherein said aspherical lens surface is a convex surface.

12. The projection exposure apparatus of claim 1, wherein lenses consisting of fluoride material are provided.

13. The projection exposure apparatus of claim 1, wherein said projection objective provides for a chromatic longitudinal aberration CHL (in nm/pm) which is less than 5‰ of the wavelength of the light of the light source.

14. The projection exposure apparatus of claim 1, wherein said light source provides for light having a wavelength λ of about 157 nm.

* * * * *

UNITED STATES PATENT AND TRADEMARK OFFICE
CERTIFICATE OF CORRECTION

PATENT NO. : 6,788,471 B2
DATED : September 7, 2004
INVENTOR(S) : Christian Wagner and Wilhelm Ulrich It is certified that error appears in the above-identified patent and that said Letters Patent is hereby corrected as shown below:

Column 2,
Line 23, insert -- = -- between "λ" and "193".

Column 4,
Line 21, delete "a" and substitute -- σ -- therefor.

Column 11,
Table 2-continued, insert -- 0.9614 -- vertically between "415.3065" and "299.6517".

Signed and Sealed this

Fourteenth Day of December, 2004

JON W. DUDAS
*Director of the United States Patent and Trademark Office*